(12) United States Patent
Chang et al.

(10) Patent No.: US 11,307,224 B2
(45) Date of Patent: Apr. 19, 2022

(54) MEASURING ROD FOR ELECTRIC METER AND ELECTRIC METER ASSEMBLY USING THE SAME

(71) Applicant: APPA Technology Corp., New Taipei (TW)

(72) Inventors: Shan-Wen Chang, New Taipei (TW); Shou-Hua Lin, New Taipei (TW)

(73) Assignee: APPA TECHNOLOGY CORP., New Taipei (TW)

( * ) Notice: Subject to any disclaimer, the term of this patent is extended or adjusted under 35 U.S.C. 154(b) by 249 days.

(21) Appl. No.: 16/374,511

(22) Filed: Apr. 3, 2019

(65) Prior Publication Data
US 2020/0158765 A1    May 21, 2020

(30) Foreign Application Priority Data

Nov. 16, 2018 (TW) ................................. 107140895

(51) Int. Cl.
  *G01R 19/15*  (2006.01)
  *G01R 1/073*  (2006.01)
  *G01R 19/155* (2006.01)
  *G01R 1/067*  (2006.01)

(52) U.S. Cl.
  CPC .......... *G01R 19/15* (2013.01); *G01R 1/06711* (2013.01); *G01R 1/073* (2013.01); *G01R 19/155* (2013.01)

(58) Field of Classification Search
  CPC .... G01R 19/15; G01R 1/06711; G01R 1/073; G01R 19/155

USPC ........................................................... 324/72
See application file for complete search history.

(56) References Cited

U.S. PATENT DOCUMENTS

| | | | | |
|---|---|---|---|---|
| 2,103,256 A | * | 12/1937 | Greenslade | G01N 27/9006 324/219 |
| 2,611,006 A | * | 9/1952 | Delmhorst | G01N 27/048 324/696 |
| 6,091,200 A | * | 7/2000 | Lenz | F21V 23/0442 315/159 |
| 6,176,717 B1 | * | 1/2001 | Campolo | H02H 5/083 361/42 |
| 7,242,173 B2 | * | 7/2007 | Cavoretto | G01R 1/04 324/72.5 |

(Continued)

FOREIGN PATENT DOCUMENTS

JP    2012088189 A  *  5/2012
JP    2017096830 A  *  6/2017

*Primary Examiner* — Giovanni Astacio-Oquendo
(74) *Attorney, Agent, or Firm* — Muncy, Geissler, Olds & Lowe, P.C.

(57) ABSTRACT

A measuring rod for an electric meter and an electric meter assembly using the same are disclosed, wherein the device to be detected disposed around the front end of at least one of the test probes allows the electric meter to determine the type of currently inserted test probes and whether the test probes are suitable for use under a current operation mode of the electric meter in a situation when the device to be detected is inserted into the electric meter; and the measuring socket corresponding to the device to be detected is disposed with a determination mechanism for allowing the electric meter to determine whether the abovementioned test probes or test probes of different types are suitable for use under a current operation mode of the electric meter.

4 Claims, 4 Drawing Sheets

(56) References Cited

U.S. PATENT DOCUMENTS

| | | | | |
|---|---|---|---|---|
| 2004/0225503 A1* | 11/2004 | Hollander | ............... | G01D 7/12 |
| | | | | 704/270 |
| 2007/0149013 A1* | 6/2007 | Eastham | ............. | H02J 13/0005 |
| | | | | 439/140 |
| 2011/0140704 A1* | 6/2011 | Son | ...................... | G01N 27/06 |
| | | | | 324/441 |
| 2011/0300753 A1* | 12/2011 | Ichikawa | .............. | B60L 3/0069 |
| | | | | 439/620.21 |
| 2015/0175192 A1* | 6/2015 | Sin | ...................... | B62D 5/0484 |
| | | | | 318/483 |
| 2015/0198548 A1* | 7/2015 | Fournier | ................ | G01N 27/00 |
| | | | | 324/114 |

\* cited by examiner

MEASURING ROD FOR ELECTRIC METER AND ELECTRIC METER ASSEMBLY USING THE SAME

FIELD OF THE INVENTION

The present invention relates to a measuring rod for an electric meter which having advantages of simple structure, low cost, and high safety, and relates to an electric meter assembly using the measuring rod.

BACKGROUND

A volt-ohm-millimeter or a clamp-on meter is a multi-purpose electronic measuring instrument, which generally includes various measuring functions such as an ammeter, a voltmeter, an ohmmeter, and the like, and is sometimes referred to as a universal meter, a general purpose multitester, and a multimeter. Such measuring instrument is mostly inserted with more than one test probe for measurement of various electronic products without limitation of space or place of use.

The conventional volt-ohm-millimeter mainly includes a main body with two sockets and a pair of test probes. Each test probe includes a probe handle, a connector that fits the main body, and a wire electrically connecting the probe handle and the connector for allowing the probe handle and the wire to extend from the main body. The probe handle allows a person to hold by one hand and guide the test probes by the other hand for measurement.

SUMMARY OF THE INVENTION

Although the electric meters described above can achieve general measurement objectives, but when measuring high voltage (1000V and higher) or high current, the electric meters have to utilize dedicated test probes for high-voltage or high-current measurement. However, in current design for the electric meters, when utilizing such dedicated test probes, the operation mode of the electric meter has to be switched to a dedicated operation mode for the dedicated test probes to obtain actuate readings. Otherwise, the user needs to calculate the readings to obtain actuate readings. Once the user neglects the switch of dedicated operation mode for the dedicated test probes, or does not further calculate the actuate readings, it is prone to misuse of incorrect results, which causes misjudgment and subsequent hazards.

The object of the present invention is to provide a measuring rod for an electric meter which having advantages of simple structure, low cost, and high safety, and provides an electric meter assembly using the measuring rod.

In order to achieve the aforementioned object, the present invention provides a measuring rod for an electric meter and an electric meter assembly using the measuring rod, wherein the measuring rod for an electric meter of the present invention consists of two test probes, and each test probe has a front end for individually inserting into a measuring socket on the electric meter and a rear end for connecting an object configured to be tested and measuring high-voltage values, high-current values, or electric resistance values of the object. Further, a device to be detected is disposed around the front end of at least one of the test probes, and the device to be detected is configured for allowing the electric meter to determine the type of currently inserted test probes and whether the test probes are suitable for use under a current operation mode of the electric meter in a situation when the device to be detected is inserted into the electric meter; and the measuring socket of the electric meter which corresponding to the at least one of the test probes with the device to be detected disposed around is disposed with a determination mechanism, wherein the determination mechanism is configured for allowing the electric meter to determine whether the test probes are suitable for use under a current operation mode of the electric meter in a situation when the at least one of the test probes with the device to be detected disposed around, or test probes of different types, are inserted into the measuring socket.

In an embodiment of the present invention, the device to be detected is a protruding part disposed around the front end of the at least one of the test probes.

In an embodiment of the present invention, the device to be detected includes a magnetic member or a sheltering member disposed around the front end of the at least one of the test probes, the magnetic member or the sheltering member is configured to allow the electric meter to determine whether the test probes are suitable for use under the current operation mode of the electric meter in a contacting or non-contacting manner.

In an embodiment of the present invention, the device to be detected is a protruding part disposed around the front end of the at least one of the test probes, and the measuring socket of the electric meter which corresponding to the at least one of the test probes with the device to be detected disposed around is disposed with a recession part corresponding to a shape of the protruding part to form the determination mechanism, so as to allow the protruding part disposed around the front end of the at least one of the test probes to be correspondingly inserted into the recession part of the measuring socket for allowing the electric meter to determine whether the test probes are suitable for use under a current operation mode of the electric meter.

In an embodiment of the present invention, the electric meter further includes a warning device connecting to the determination mechanism for the determination mechanism to send out a warning signal in a situation when the determination mechanism determines the test probes are not suitable for measuring high-voltage values, high-current values, or electric resistance values. Further, the warning signal includes a light warning or a sound warning.

Other objects, advantages and novel features of the present invention will become more apparent from the following detailed description when taken in conjunction with the accompanying drawings.

DETAILED DESCRIPTION

Figure 1:
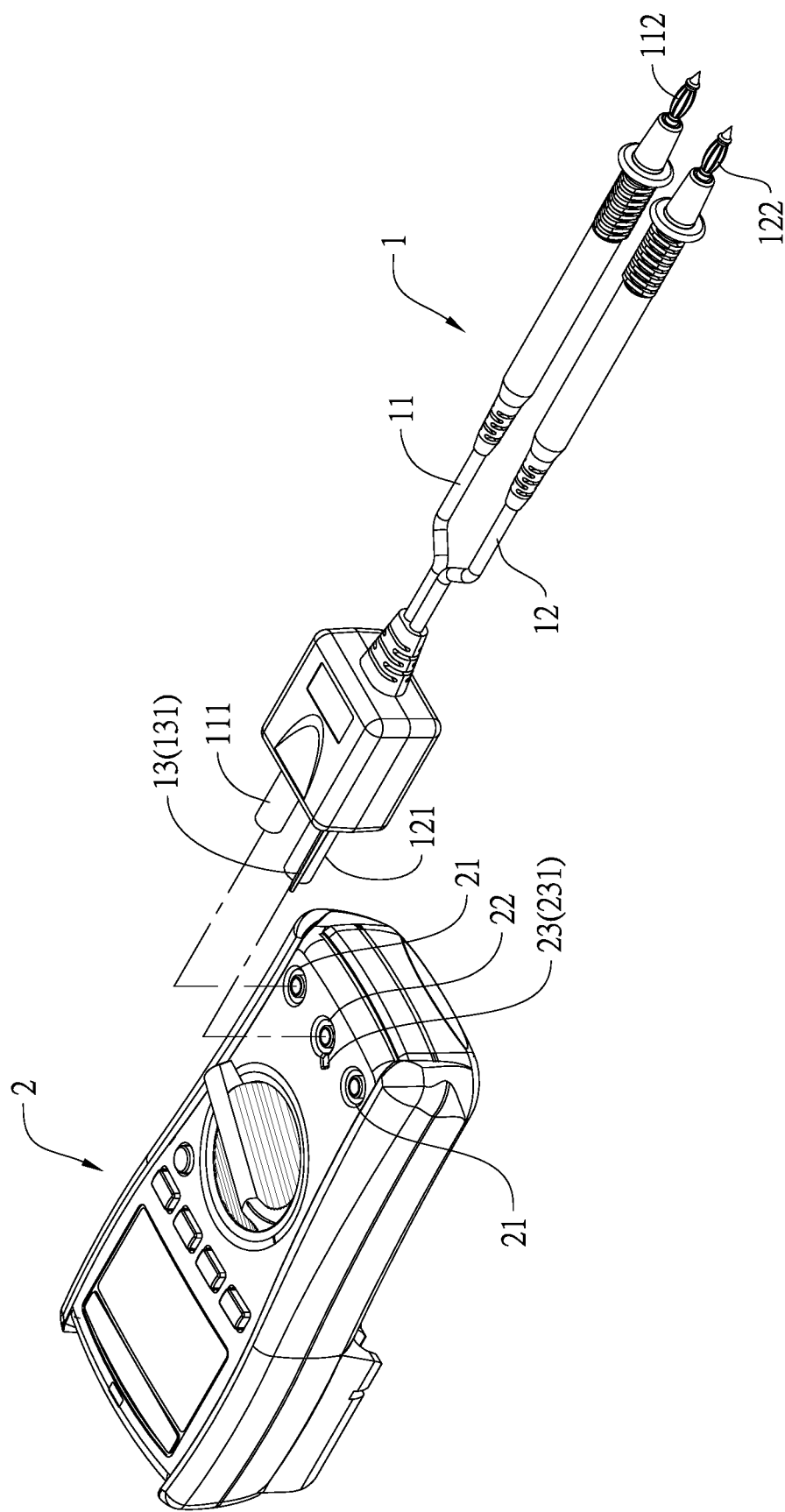
FIG. 1 is a perspective view of an embodiment according to the present invention applied with a multimeter.
Figure 2:
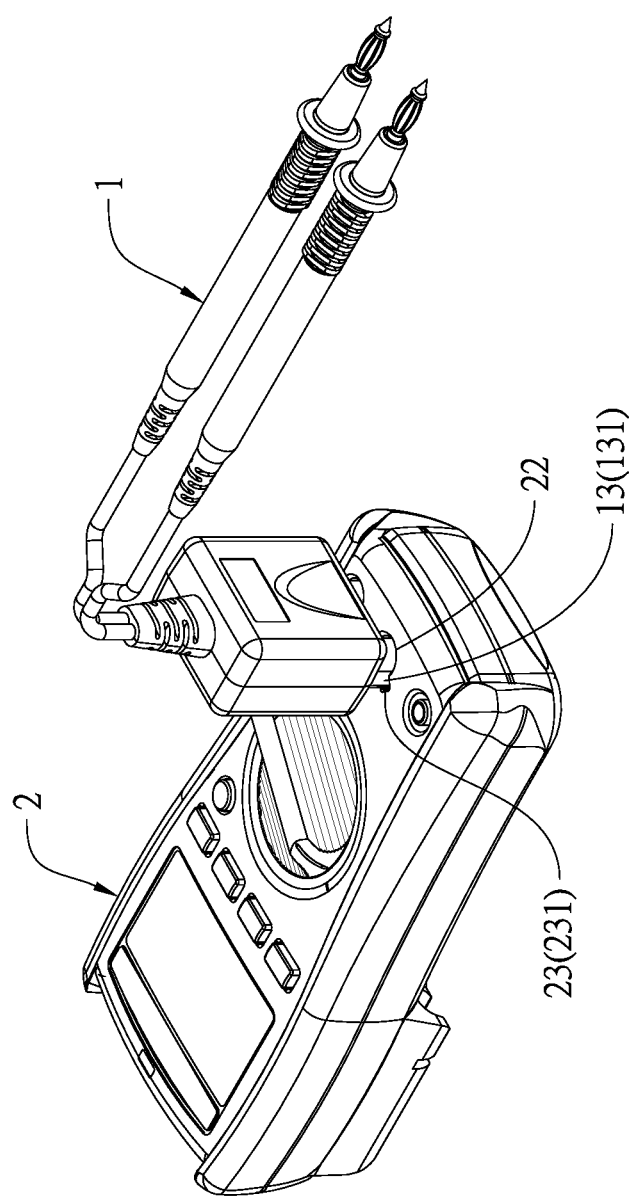
FIG. 2 is a perspective view of the embodiment of FIG. 1 after connecting to the multimeter.
Figure 3:
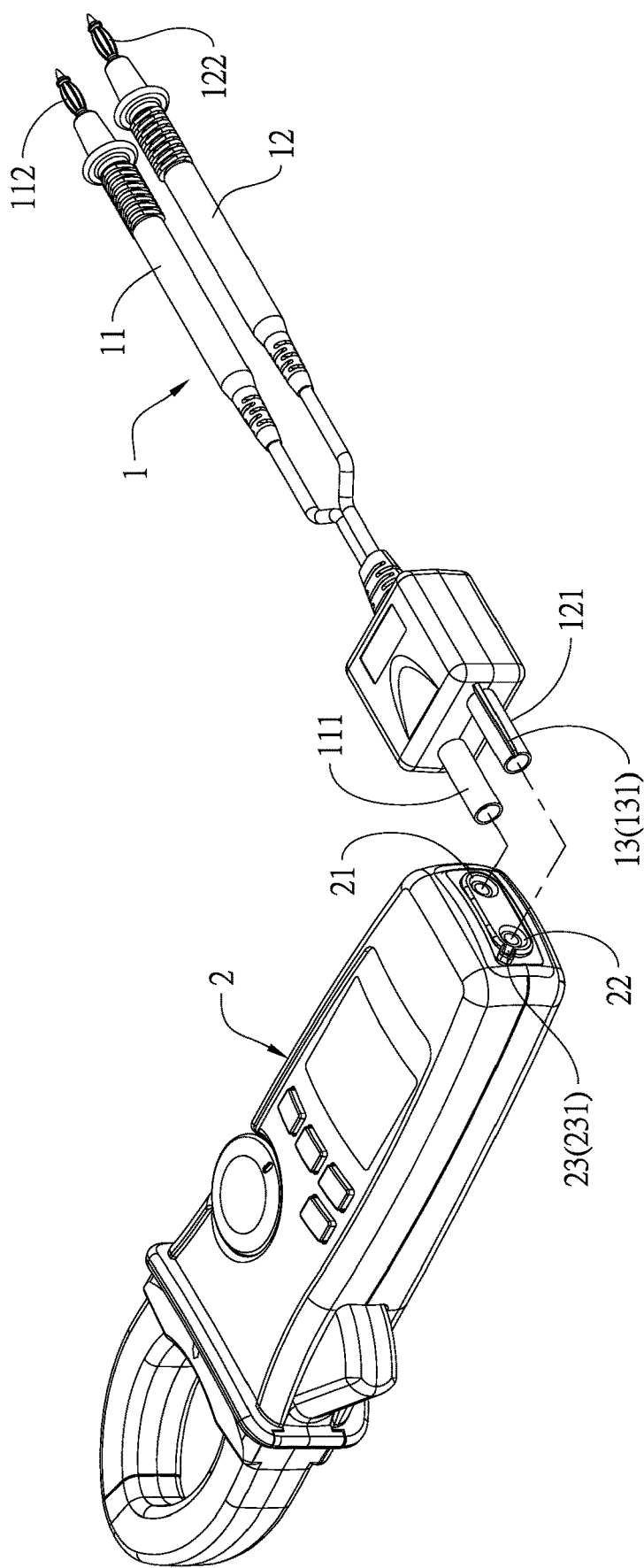
FIG. 3 is a perspective view of another embodiment according to the present invention applied with a clamp-on meter.
Figure 4:
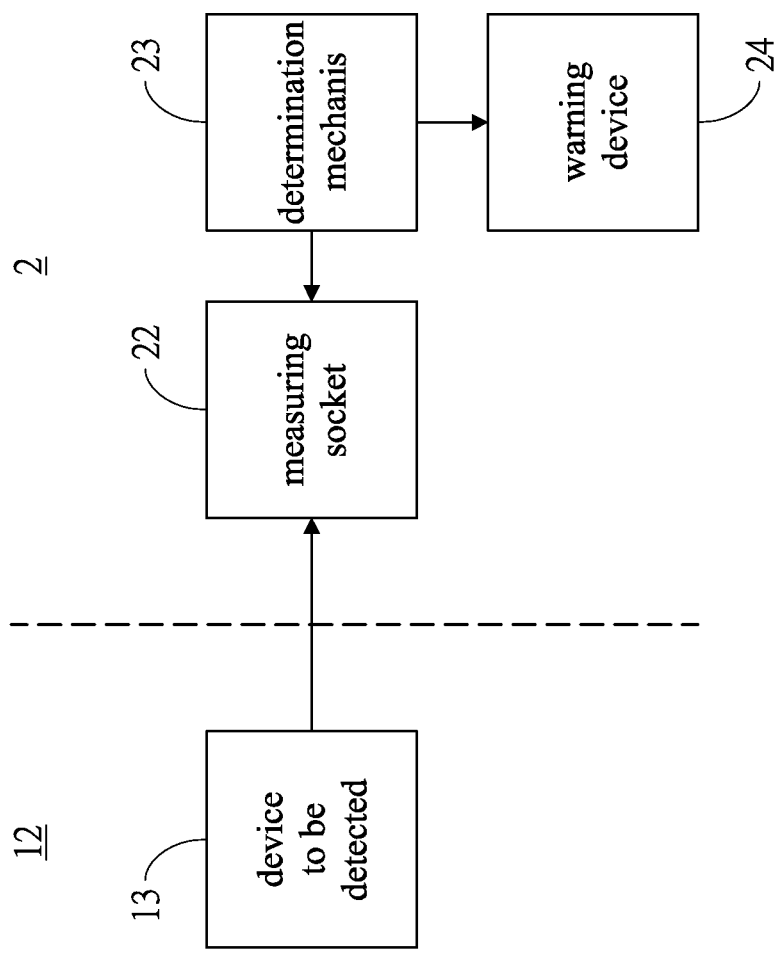
FIG. 4 is a partial schematic block diagram of the embodiment of FIG. 1 according to the present invention.

Referring to FIGS. 1-4, a measuring rod 1 for an electric meter 2 and an electric meter assembly using the measuring rod of an embodiment of the present invention are illustrated.

The measuring rod 1 consists of two test probes 11, 12, and each of test probes 11, 12 has a front end (111, 121) for individually inserting into a measuring socket (21, 22) on the electric meter 2 and a rear end (112, 122) for connecting an object configured to be tested and measuring high-voltage values, high-current values, or electric resistance values of the object. Further, a device to be detected 13 is disposed around the front end 121 of the test probe 12.

The device to be detected 13 is a protruding part 131 disposed around the front end 121 of the test probe 12 (as shown in FIG. 1), or configured to be a magnetic member or a sheltering member, and thereby, according to the device to be detected 13, allowing the electric meter 2 to determine whether the test probe 12 is suitable for use under the current operation mode of the electric meter 2 by a contacting or non-contacting manner (such as the magnetic induction or light induction).

The electric meter 2 together with the measuring rod 1 forms an electric meter assembly. The measuring socket 22 of the electric meter 2 which corresponding to the test probe 12 with the device to be detected 13 disposed around is disposed with a determination mechanism 23, wherein the determination mechanism 23 is configured for allowing the electric meter 2 to determine whether the test probe 12 is suitable for use under a current operation mode of the electric meter 2 in a situation when the test probe 12 with the device to be detected 13 disposed around are inserted into the measuring socket 22.

In a case that the device to be detected 13 is configured to be a protruding part 131 disposed around the front end 121 of the test probe 12, the measuring socket 22 of the electric meter 2 which corresponding to the test probe 12 with the device to be detected 13 disposed around is disposed with a recession part 231 corresponding to a shape of the protruding part 131 to form the determination mechanism 23, so as to allow the protruding part 131 disposed around the front end 121 of the test probe 12 to be correspondingly inserted into the recession part 231 of the measuring socket 22 for allowing the electric meter 2 to determine whether the test probe 12 is suitable for use under a current operation mode of the electric meter 2. That is, if a conventional measuring rod without the protruding part 131 on the market is inserted, the conventional measuring rod would not be a measuring rod for measuring high-voltage values or high-current values; or when a conventional measuring rod cannot successfully inserted into the electric meter of the present invention, the conventional measuring rod would not be the measuring rod for measuring high-voltage values or high-current values.

The present invention certainly can provide a warning device 24 on the electric meter 2. The warning device 24 is electrically connecting to the determination mechanism 23 for the determination mechanism 23 to send out a warning signal such as a light warning or a sound warning in a situation when the determination mechanism determines the test probes are not suitable for measuring high-voltage values, high-current values, or electric resistance values, so that even when a conventional measuring rod without the protruding part can successfully inserted into the electric meter of the present invention, the determination mechanism 23 still would send out a warning due to the lack of the protruding part.

Therefore, even when used by an inexperienced user or used in a dark environment, the configuration of the present invention can prevent a common measuring rod to be used in the circumstance of high-voltage/high-current measurements. Further, the design of present invention can distinctly and immediately distinguish the measuring rod, so as to prevent people from inadvertently injured and prevent damage to the appliance. Furthermore, the design of present invention also can prevent users from using the measuring rod 1 having the protruding part 131 with a common electric meter incapable of high-voltage/high-current measurement and subsequent inaccurate measuring results which may cause people injured or cause the appliance damaged.

It should be understood that different modifications and variations could be made from the disclosures of the present invention by the people familiar in the art, which should be deemed without departing the spirit of the present invention.

As stated in the above disclosed, the present invention can surely achieve its expected objects to provide a measuring rod for an electric meter and an electric meter assembly using the same which are industrial applicable.

What is claimed is:

1. An electric meter assembly comprising an electric meter and a measuring rod for the electric meter, wherein
the measuring rod consists of two test probes, and each test probe has a front end for individually inserting into a measuring socket on the electric meter and a rear end for connecting an object configured to be tested and measuring high-voltage values, high-current values, or electric resistance values of the object;
a device to be detected is disposed around the front end of at least one of the test probes;
the measuring socket of the electric meter which corresponding to the at least one of the test probes with the device to be detected disposed around is disposed with a determination mechanism, wherein the determination mechanism is configured for allowing the electric meter to determine whether the test probes are suitable for use under a current operation mode of the electric meter in a situation when the at least one of the test probes with the device to be detected disposed around are inserted into the measuring socket; and
the electric meter has a warning device connecting to the determination mechanism for the determination mechanism to send out a warning signal in a situation when the determination mechanism determines the test probes are not suitable for measuring high-voltage values, high-current values, or electric resistance values.

2. The electric meter assembly according to claim 1, wherein the device to be detected is a protruding part disposed around the front end of the at least one of the test probes, and the measuring socket of the electric meter which corresponding to the at least one of the test probes with the device to be detected disposed around is disposed with a recession part corresponding to a shape of the protruding part to form the determination mechanism, so as to allow the protruding part disposed around the front end of the at least one of the test probes to be correspondingly inserted into the recession part of the measuring socket for allowing the electric meter to determine whether the test probes are suitable for use under a current operation mode of the electric meter.

3. The electric meter assembly according to claim 1, wherein the device to be detected includes a magnetic member or a sheltering member disposed around the front end of the at least one of the test probes, the magnetic member or the sheltering member is configured to allow the electric meter to determine whether the test probes are suitable for use under the current operation mode of the electric meter in a contacting or non-contacting manner.

4. The electric meter assembly according to claim 1, wherein the warning signal includes a light warning or a sound warning.

\* \* \* \* \*